United States Patent [19]
Singh

[11] Patent Number: 5,233,614
[45] Date of Patent: Aug. 3, 1993

[54] FAULT MAPPING APPARATUS FOR MEMORY

[75] Inventor: Shanker Singh, Tuscon, Ariz.

[73] Assignee: International Business Machines, Armonk, N.Y.

[21] Appl. No.: 637,731

[22] Filed: Jan. 7, 1991

[51] Int. Cl.$^5$ ............................................. G11C 29/00
[52] U.S. Cl. ................................. 371/21.6; 371/21.1; 371/5.1; 371/2.2; 364/246.3
[58] Field of Search ....................... 371/21.6, 21.1, 2.1, 371/2.2, 5.1, 10.1, 51.1, 40.1, 40.2, 40.3, 5.5, 13; 364/243, 246.3, 200

[56] References Cited

U.S. PATENT DOCUMENTS

| | | | |
|---|---|---|---|
| 4,051,460 | 9/1977 | Yamada et al. | 371/10.1 |
| 4,479,214 | 10/1984 | Ryan | 371/21.6 |
| 4,506,364 | 3/1985 | Arichelmann, Jr. et al. | 371/2.2 |
| 4,601,031 | 7/1986 | Walker et al. | 371/51.1 |
| 4,736,373 | 4/1988 | Schmidt | 371/21.6 |

Primary Examiner—Robert W. Beausoliel, Jr.
Assistant Examiner—Trinh Tu
Attorney, Agent, or Firm—F. E. Anderson; D. A. Shifrin

[57] ABSTRACT

A memory fault mapping apparatus detects faults generated in a memory array during on-line operation. As the memory array is randomly accessed, single bit error are detected, corrected, and mapped into an error memory. The errors may be mapped in an error memory having a memory location for each memory of the memory array or alternatively, by grouping memories together and when the errors generated by any one group exceeds a predetermined threshold of errors, testing only the memories in that group off-line. By grouping the memories a substantial reduction in the amount of error memory required can be achieved. A SEC/DED syndrome generator detects single and double bit errors, correcting the single bit errors while providing an indication of which memory generated the error. An error memory stores error counts for the memory array, each error count indicating the number of errors for a specific memory or a group of memories. The error counts are incremented by loading the error count into a counter for incrementing then writing the incremented error count back to the error memory location from which it was read.

26 Claims, 4 Drawing Sheets

FIG. 2

FAULT STATUS DATA FORMAT

FAULT MAPPING APPARATUS FOR MEMORY

FIELD OF THE INVENTION

This invention relates generally to the field of memory fault mapping, and more particularly to an apparatus and method of fault mapping memory while on-line.

BACKGROUND OF THE INVENTION

Computer systems traditionally use several different types of storage for retaining data. The ideal storage provides high speed writing and reading of data, has a low cost per unit of data stored, and stores the data reliably. Solid state electronic memory, hereinafter referred to as memory, has the characteristic of high speed access but the quantity of memory that can be provided is limited by its higher cost per unit of data. Memory is also volatile in that it loses the stored data when power is removed. Magnetic and optical disks can provide much greater storage capacity at a lower cost. Unlike memory, the magnetic and optical disks are nonvolatile in that data is retained in the absence of power. However, access to the data stored on magnetic and optical disks is much slower compared to memory. A higher storage capacity at yet a lower cost but with still slower access speed is provided by magnetic tape storage.

Increasing the speed at which a computer operates is a major driving force of every new generation of computers and the time to access or store data is a major factor in determining that speed. Hence there is a constant demand for increasing the amount of memory provided in today's computers. Using larger amounts of memory also increases the number of errors that are generated since an increased number of components are required and the increased probability of component failure necessarily follows. Requirements for reliability necessitate that a mechanism be provided for checking the contents of memory for accuracy and replacing faulty memory when found.

One technique of detecting and correcting errors in a memory is described in "Error Correction Technique Which Increases Memory Bandwidth and Reduces Access Penalties", IBM Technical Disclosure Bulletin, Vol. 31, No. 3, August 1988, pp. 146-149. This technique uses redundant memory banks where identical data is stored in each memory bank. Redundant memory has the advantage of correcting errors very quickly. However, the higher cost of memory is exacerbated since twice the amount of memory is required. This technique is therefore limited to applications with relatively smaller memory requirements and a very high speed priority.

A less expensive and more common solution to increasing memory reliability is to use Error Checking and Correcting (ECC) circuitry. With ECC a single bit error in a data word can be detected and corrected (also known as Single bit Error Correction (SEC)) This is especially useful in Dynamic Random Access Memory (DRAM) where soft errors may occur, that is, errors not due to the physical structure of the DRAM but due to alpha particles randomly hitting the memory chip or due to excessive noise conditions during read/write operations. When more than one bit error exists per data word detection and correction becomes substantially more complex. Double Error Detection (DED) may be provided in order to provide notice of the errors while no attempt at correction is made. Double error correction could be provided although the additional requirements for doing so are substantial.

A method of scattering errors in a memory array so as to diminish the likelihood of double errors which may be prohibitively too expensive for correction is described by Bond, et al., in U.S. Pat. No. 4,488,298. Scattering is accomplished in an array of memories by preventing two or more defective bits from aligning by selectively rearranging columns of the different memories based on an error map created for the array of memories. The error map is created off-line with each memory being tested with known data. The time to create the error map increases proportionately as the amount of memory increases. Very large memory arrays could take hours to map and scatter.

Fault mapping to determine the type of error that exists may be accomplished by storing known data in the memories (off-line) and sequentially reading the data back out and comparing it with the known written data. The errors are counted and based on the number and location of errors, the type of error is determined, i.e., single bit, bit line or word line. This method is disclosed by Ryan in U.S. Pat. No. 4,456,995. Based on the generated fault map, the bits may be scattered as described by Bond, et al. Typically, when a computer is first turned on, memory is tested one row at a time (off-line) and as each row passes it is given to the operating system to be used by the computer. As the amount of memory integrated into computers continues to expand this method becomes less desirable since testing time may become prohibitively long and the probability of an uncorrectable error occurrence continues to increase over time.

An improvement is realized by mapping errors on-line as described by Ryan in U.S. Pat. No. 4,479,214 ('214) which is hereby incorporated by reference. The system described in '214 operates much faster than the above described systems and methods. However, the speed increase comes at a cost of additional hardware. For example, 73 counters are required for a memory system having a 72 bit word, that is, one counter for each column of bits and an additional counter to keep track of the number of memory accesses so that a ratio of errors to accesses may be determined. Furthermore, the system described in '214 creates a fault map for one partition of the memory system at a time. When faults are found that would be uncorrectable by ECC the memory subsystem is then repartitioned (scattered). This reactive approach improves on test speed but requires a substantial amount of hardware and cannot identify memory that may need replacement in the future, i.e., in a preventative manner.

Thus what is needed is a fault mapping apparatus able to identify memory on-line that is likely to fail while using a minimum amount of hardware.

SUMMARY OF THE INVENTION

Accordingly, it is an object of the present invention to provide an improved on-line fault mapping apparatus for memory.

Another object of the present invention is to provide an on-line fault mapping apparatus for memory that provides a proactive indication of a memory that may need to be replaced.

Yet another object of the present invention is to provide an on-line fault mapping apparatus for memory that requires a reduced amount of hardware.

Still another object of the present invention is to provide an on-line fault mapping apparatus for memory that provides the mapping function by making independent maps of portions of the memory.

These and other objects of this invention are accomplished by a memory fault mapping apparatus which provides a count of errors generated by each of a plurality of memory chips. A detecting circuit checks data randomly accessed from the plurality of memory chips during on-line operation providing an indication of each error that exists in the accessed data. An error memory is coupled to the detecting circuit for storing a count of the number of errors currently detected for each memory, the count for each memory being stored in a predetermined location. A counting circuit coupled to the error memory and detecting circuit receives the count of a currently accessed memory from the error memory and if the detecting circuit indicates that an error exists, the counter increments the count. The incremented count is written back to the error memory at its predetermined location. As a result, only a single counter is required regardless of the number of bits accessed in a read operation.

The foregoing and other objects, features and advantages of the invention will be apparent from the following more particular description of the preferred embodiment of the invention, as illustrated in the accompanying drawing.

DESCRIPTION OF THE PREFERRED EMBODIMENT

Figure 1:
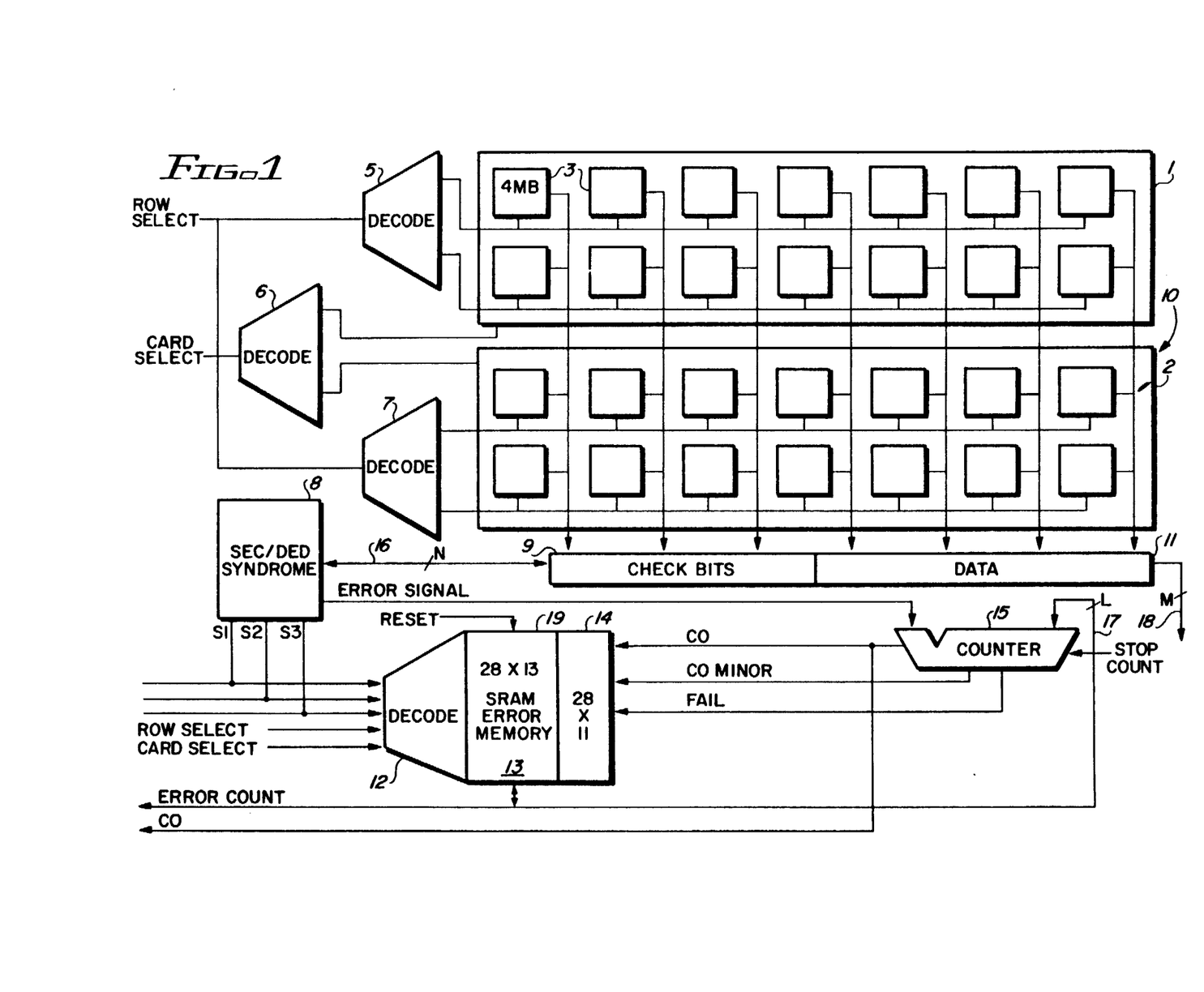
FIG. 1 is a block diagram of a first embodiment of a fault mapping apparatus for memory according to the present invention.

FIG. 1 depicts a memory fault mapping apparatus 10 in block diagram form. The memory fault mapping apparatus 10 tracks the number of errors that occur in each memory chip accessed in a computer system during on-line operation. The present invention is illustrated using two memory cards 1 and 2, each having a plurality of 4 megabit memories 3. Normally much larger amounts of memory would be mapped but a smaller amount is shown for the sake of illustrative simplicity. Whenever a row of memory is accessed, the data is checked for errors and, if an error is found, the memory which generated the error is determined and a count of errors for that memory is retained. When the count for any memory reaches a predetermined magnitude remedial actions may be taken.

A decoder 5 and a decoder 7 are connected to the plurality of memories 3 with each decoder 5 and 7 receiving an address signal (row select) for selecting one row of memory of the plurality of memories 3. Further selection of the memories is made by the decoder 6 which selects one of the cards 1 or 2 from a card select address that is input to the decoder 6. The decoding step results in seven memories of the plurality of memories 3 from the cards 1 or 2 being selected for a read or write operation. During a read operation seven bits of data are made available, one bit from each of the selected memories of the plurality of memories 3 to form a seven bit ECC word (Error Checking and Correction). The seven bit ECC word is given only as an example as it is common to have larger ECC words, for example, seventy two bit ECC words are common. Three of the seven bits represent check bits and the remaining four bits represent data.

A SEC/DED syndrome generator 8 (Single Error Correct/Double Error Detect) is connected to a check bit buffer 9 by a bus 16 for receiving the three check bits. The check bit buffer 9 is connected to the plurality of memories 3 making up the three MSB (Most Significant Bits) of the seven bit ECC word. A non-zero syndrome represents that a single bit error has been detected and automatically corrected or that an uncorrected double error has been detected. A single bit error that has been corrected appears on a data bus 18 which is connected to a data buffer 11 and carries the data bits as output from the data buffer 11. The SEC/DED syndrome generator 8 outputs a three bit syndrome made up of three signals S1, S2 and S3 which form a column address signal to identify a single column from the plurality of memories 3 in which the error is detected. An error signal is also provided by the SEC/DED syndrome generator 8 which simply provides an indication that an error has been detected. For example, a "high" error signal represents an error and a "low" error signal represents the absence of an error.

An error memory 13 is a fast SRAM (Static Random Access Memory) for storing the number of errors detected in each memory of the plurality of memories 3. The error memory 13 has simultaneous read/write capability and is able to operate at twice the speed of the plurality of memories 3. There exists a corresponding memory location in the error memory 13 for each memory of the plurality of memories 3 for mapping the fault status of each such memory. Therefore the error memory 13 includes a 28 by 24 memory array (an array consisting of 28 words each having a length of 24 bits). The error memory 13 is logically split into two arrays 14 and 19 where the array 19 is 28 words by 13 bits and the array 14 is 28 words by 11 bits. The array 19 stores an error count and the array 14 stores a status word for each memory of the plurality of memories 3. Each error count and status word combine to form a fault status for a corresponding memory. The error memory 13 also includes a decoder 12 which is connected to the SEC/DED syndrome generator 8. The decoder 12 receives an address that is identical to the address of a memory of the plurality of memories 3 that has a faulty output. The address to the decoder 12 includes row select, card select and the three bit syndrome.

A counter 15 is connected to both the error memory 13 and the SEC/DED syndrome generator 8. A bus 17 having L bits connects the array 19 to the counter 15 where L is the number of bits in the error count. In the memory fault mapping system 10 the error count is composed of 13 bits so L would be equal to 13. If a larger or smaller error count were desired the value of L would reflect that number enabling the counter to receive the error count. The counter 15 receives the error count for a presently addressed memory of the plurality of memories 3 (the first 13 bits of the addressed word in error memory 13) via the bus 17. An error signal is provided to the counter 15 from the SEC/DED syndrome generator 8 for instructing the counter whether or not to increment the error count. The error count (incremented or not) is made available to the error memory 13 via the bus 17 for writing therein. The counter 15 provides a Carry Out (CO) signal, a Carry Out Minor signal (CO minor) and a Fail signal to the error memory 13. These signals update the status word of the presently addressed fault status and are described in more detail below.

METHOD OF OPERATION

The memory fault mapping apparatus 10 operates during normal computer operation or on-line. As a result, a long wait time for testing memory is not required during the initial start-up of the computer. When the computer accesses the plurality of memories 3 the row select and card select addresses are simultaneously provided to the decoders 5, 6, and 7, and to the error memory 13 via decoder 12. An ECC word from the plurality of memories 3 is then provided to the check bits buffer 9 and the data buffer 11. If a single bit error is detected in the ECC word that bit is corrected in the check bits buffer 9 and the data buffer 11. The SEC/DED syndrome generator 8 receives information regarding the status or absence of the error via bus 16. If an error was detected and corrected the three bit syndrome will reflect which column the error existed in. If no error existed, the three bit syndrome may so indicate by outputting all "zeros". By indicating the column in which an error was detected the specific memory of the plurality of memories 3 outputting the error is identified and its unique address is applied to the error memory 13. The address to the error memory 13 includes the row select and card select addresses and the three bit syndrome. As a result, each time a memory of the plurality of memories 3 outputs a detected error, an address corresponding to that memory is provided to the error memory 13.

The error memory 13 stores 28 error counts, one for each memory of the plurality of memories 3. Since an address for the faulty memory is applied to the error memory 13 the error count for that memory is output from the error memory 13 onto the bus 17 and into the counter 15. As described earlier the error signal will be "high" to indicate to the counter 15 that an error was detected. The counter 15 will thus increment the error count contained therein to reflect the current number of errors detected for the memory that produced the error. Because the error memory 13 operates at a speed at least twice that of the plurality of memories 3, the incremented error count may be written back to the error memory 13 before the current address is removed. Reading data from the plurality of memories 3 is completed in one cycle and so reading an error count, incrementing, and writing the error count back is also accomplished in a single cycle. If no error was found an invalid address is provided to the error memory 13 and the contents therein remain unchanged. After a finite time, each location in the error memory 13 contains the number of corrected single bit errors for all read operations in the memory fault mapping system 10.

The occurrence of a double error will be detected by the SEC/DED syndrome generator 8 but such an error is not indicated by the error signal and hence not counted. Instead the memory fault mapping system 10 could take other appropriate actions such as indicating that repair is necessary or make certain the addressed memory location is not used in the future. Alternative designs could embody a circuit for logically "ORing" double errors and counting one of the faulty bits. Yet another design could embody the use of double error correction circuitry and/or triple error detection.

Figure 2:
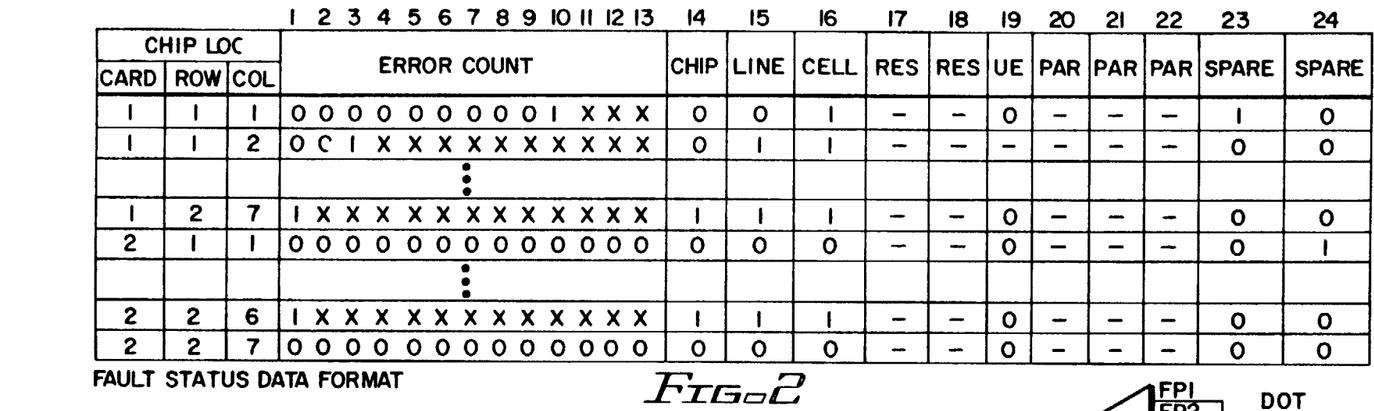
FIG. 2 is a table of the error count format as stored in an error memory according to the present invention.

FIG. 2 shows the format of the fault statuses stored in the error memory 13. The error count for each memory of the plurality of memories 3 are stored in the first thirteen bits of each of the 28 memory locations in the error memory 13. The error count for the memory at chip location (CHIP LOC) card 1, row 1, column 1 (1,1,1) is depicted as having a relatively low number of errors detected. Bit 13 of the error count represents the Least Significant Bit (LSB) of the binary representation of the number of errors stored therein while bit 1 is the MSB. Every time an error is detected for the memory at chip location 1,1,1 this error count is loaded into the counter 15, incremented, and the written back to the same error memory location. When an error count reaches different predetermined thresholds, symptomatic memory chip failures may be indicated. These suspected memory chip failures are indicated by the status words contained in bits 14–24 of the error memory 13.

The status words contain three bits fields 14, 15, and 16 to indicate whether a chip kill, line kill or cell kill, respectively, is suspected based on the corresponding error count. The chip, line and cell kill bits are set when the corresponding error count is written back to the error memory 13. When an error count reaches a predetermined threshold, the counter 15 determines that an overflow bit has been set for a predetermined bit of that error count. The chip, line and cell kill bits are set by the CO minor, CO and fail signals supplied to the error memory 13 by the counter 15. This is illustrated by example in FIG. 2 where the error count for chip location 1,1,1 shows bit 10 as the MSB set to one and thereby causing the cell kill bit to be set. The error count for chip location 1,1,2 shows bit 3 as being the MSB set and therefore indicating a greater number of errors thereby setting the line kill bit. Likewise the error count for chip location 1,2,7 shows bit 1 as being set causing the chip kill bit to be set.

If the cell kill bit for a memory has been set, it is presumed that the errors are not due to soft errors but that that memory has a defective cell. If the higher predetermined threshold of errors has been detected for a memory such that the line kill bit has been set then a line failure will be suspected. Likewise if the still higher predetermined threshold of errors necessary to set the chip kill bit has been reached then a defective memory array module is suspected. Because the plurality of memories 3 are accessed randomly, an indication of a chip, line or cell kill will only be symptomatic. Confirmation of such a failure is accomplished, for example, by performing a sequential read for those memories having suspected defects. As a result, a memory chip that is very likely to fail in the future or that is currently defective may be found without having to test every memory of the plurality of memories 3. This provides the ability to bring a computer down for repairs at a more convenient time rather than being inconvenienced by a sudden failure.

The status words contain two bits 17 and 18 which are reserved for future use. Bit 19 is used to indicate Uncorrectable Errors (UE) as detected, for example, by Double Error Detection. Bits 20, 21, and 22 of the status words provide a parity check for the contents of the error memory 13 itself (i.e., in the array 19). There are two more bits 23 and 24 which are used to indicate whether a spare memory has been used to replace a defective memory of the plurality of memories 3. The status words provide a quick summary of the condition of the plurality of memories 3 by monitoring only a few bit fields. The status words can also provide a historical record by copying them onto a maintenance disk for future reference. A reset signal is supplied to the error memory 13 so that an internal timer (not shown) or service request can reset the fault statuses from time to time.

ALTERNATIVE EMBODIMENT OF THE PRESENT INVENTION

The memory fault mapping apparatus 10 is a single pass system in that all of the detected single bit errors of the plurality of memories 3 are mapped in the error memory 13 during on-line operation. This has the advantage of simplicity but for very large memory systems a disadvantage exists in that a large error memory 13 would be required. For example, the memory fault mapping apparatus 10 the plurality of memories 3 consists of only 28 memories hence the error memory 13 only consists of an array of 28 words However, a plurality of memories consisting of 2 cards 1 and 2, each card having 8 rows, and each row having 72 bits would require an error memory 13 having 72 * 8 * 2 words or 1152 words.

Figure 3:
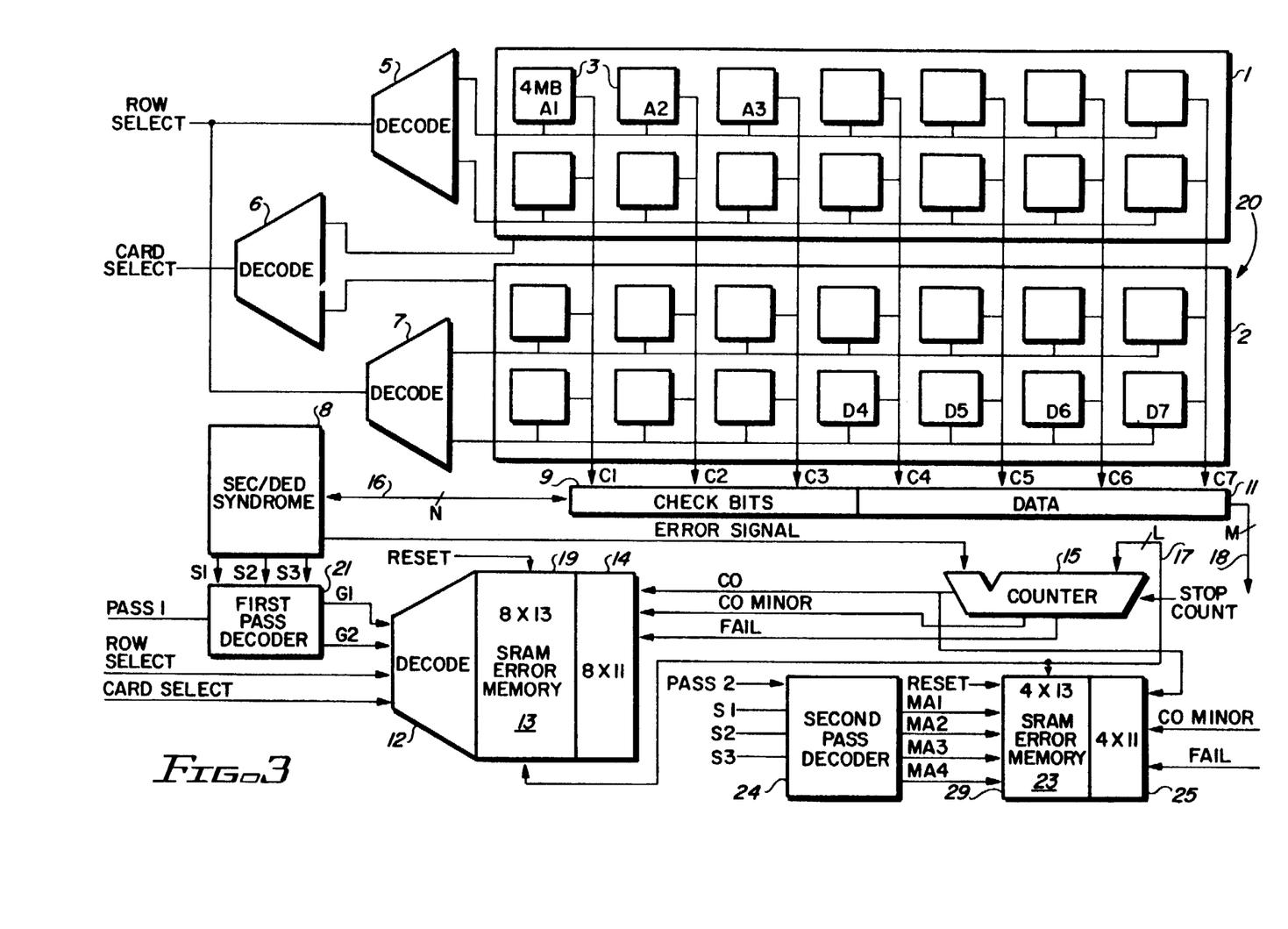
FIG. 3 is a block diagram of a second embodiment of a fault mapping apparatus for memory using a two pass mapping method.

FIG. 3 is a block diagram of a memory fault mapping apparatus 20 which uses a multi-pass method of mapping memory errors. Like numerals are used in FIG. 3 to represent like structures in FIG. 1. The memory fault mapping apparatus 20 is similar to the memory fault mapping apparatus 10 with the differences set out below. The error memory 13 only requires an array of 8 words by 24 bits each. The format of the fault statuses contained therein as shown in FIG. 2 remains the same. The three bit syndrome output (S1, S2 and S3) is no longer connected to the error memory 13 but is instead connected to a first pass decoder 21 and a second pass decoder 24. The first pass decoder 21 has two outputs, group 1 (G1) and group 2 (G2) connected to the decoder 12 of the error memory 13. The second pass decoder 24 has four masked outputs, MA1-MA4, each of which represent one of the columns C1-C3 or C4-C7 from the plurality of memories 3 and are connected to an error memory 23. The error memory 23 is an array having 4 words of 24 bits each which is logically divided into two arrays 29 and 24. The array 29 is a 4 by 13 array and stores error counts and the array 25 is a 4 by 11 array and stores status words, each status word corresponding to an error count in the array 29. The counter 15 is connected to the error memory 23 by the bus 17 and the counter 15 further provides the signals CO, CO minor, and fail thereto. The reset signal is also connected to the error memory 23.

The memory fault mapping apparatus 20 is a two pass error mapping system in that it requires two distinct steps to map the errors of a suspected faulty memory. During the first pass errors are mapped for predetermined groups of memories such that the errors attributed to any single memory is not known. If a predetermined threshold of errors is reached for any group of memories mapped then the second pass of mapping is initiated. During the second pass of memory mapping each of the memories of the plurality of memories 3 that are contained within that group are mapped individually so that any single suspected faulty memory can then be isolated and identified.

Operation of the memory fault mapping apparatus 20 using the two pass method is described mapping the errors in the plurality of memories 3 which is very small and used for the sake of simplicity. It can be appreciated that mapping very large memory, arrays using the present invention is more desirable. The plurality of memories 3 are first divided into two groups, G1 consisting of the memories making up columns C1-C3 and G2 consisting of the memories making up columns C4-C7. These groups are each further divided into 4 more subgroups depending on whether they are on card 1 or 2 and further by which row the memories are located in. A total of eight subgroups are formed for fault mapping during the first pass. As an example, the subgroup of memories forming C1-C3 (G1) on card 1 in the top row are the three memories A1-A3, and the subgroup of memories forming C4-C7 (G2) on card 2 in the bottom row are the memories D4-D7. Accordingly, the error memory 13 has 8 words for providing one error count for each subgroup of memories.

During normal on-line operation the plurality of memories 3 are randomly accessed. If a single error is detected and corrected from one of the memories of the plurality of memories 3, that error is counted as a subgroup error of one of the eight subgroups. For example, if the single error came from one of the columns C1-C3 then the G1 signal would be "high". Likewise, if the single error came from one of the columns C4-C7 then the G2 signal would be "high". The row select and card select signals narrow the error down to the subgroup from which the error came from. As a result it is not known which specific memory generated the fault but only that one of the memories within a subgroup generated the fault. The error memory 13 will thus be addressed according to a subgroup address as defined by G1, G2, row select, and card select. The method of incrementing an error count is the same as described above, that is the error count from the error memory 13 is loaded into the counter 15, incremented by one and written back into the error memory 13 within a single access time of the plurality of memories 3.

Figure 4:
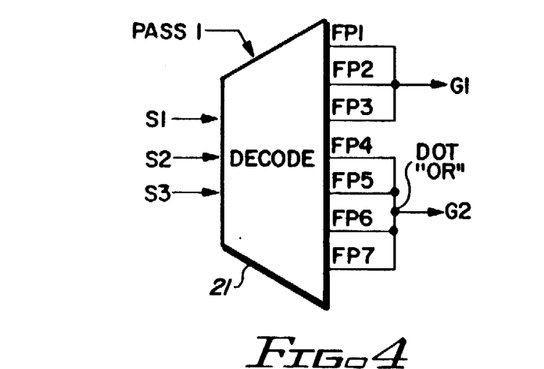
FIG. 4 is a logic diagram of a first pass decoder circuit.

FIG. 4 is a more detailed logic diagram of the first pass decoder 21. The first pass decoder 21 is enabled by a pass1 signal connected thereto. The first pass decoder 21 is a one of seven decoder wherein the three bit syndrome, S1-S3, from the SEC/DED syndrome generator 8 is received and decoded so that at most only one of the seven first pass outputs FP1-FP7 would be "high" (FP1-FP7 are representative of errors on the C1-C7 outputs from the plurality of memories 3). If an error were detected from the memory A1, then FP1 would be "high" or if an error were detected from the memory A3 then FP3 would be "high". The outputs FP1-FP3 are dot "OR'd" to form G1 and the outputs FP4-FP7 are dot "OR'd" to form G2. Thus the error count for the subgroup of memories made up of A1-A3 is a total count of errors for that subgroup and a second pass is required to determine the error count for each individual memory in that subgroup.

The second pass is initiated when any one error count for one of the eight subgroups of memories reaches a predetermined threshold such that a faulty memory is suspected. Since the existence of a faulty memory is probable based on the first pass determination the second pass test is done off-line sequentially writing and reading data from the suspected faulty memories within the identified subgroup. While the off-line test is more time consuming it is still advantageous since only a small number of memories are being tested and an accurate test is accomplished. The second pass decoder 24 is enabled by a pass2 signal connected thereto. The pass1 and pass2 signals are mutually exclusive so that when the second pass decoder 24 is enabled the first pass decoder 21 is disabled. During the second pass of fault mapping only the errors for the suspected subgroup are counted. These error counts are stored in the error memory 23 with the counter 15 doing the necessary incrementing in the same manner accomplished for the error counts stored in the error memory 13.

Figure 4A:
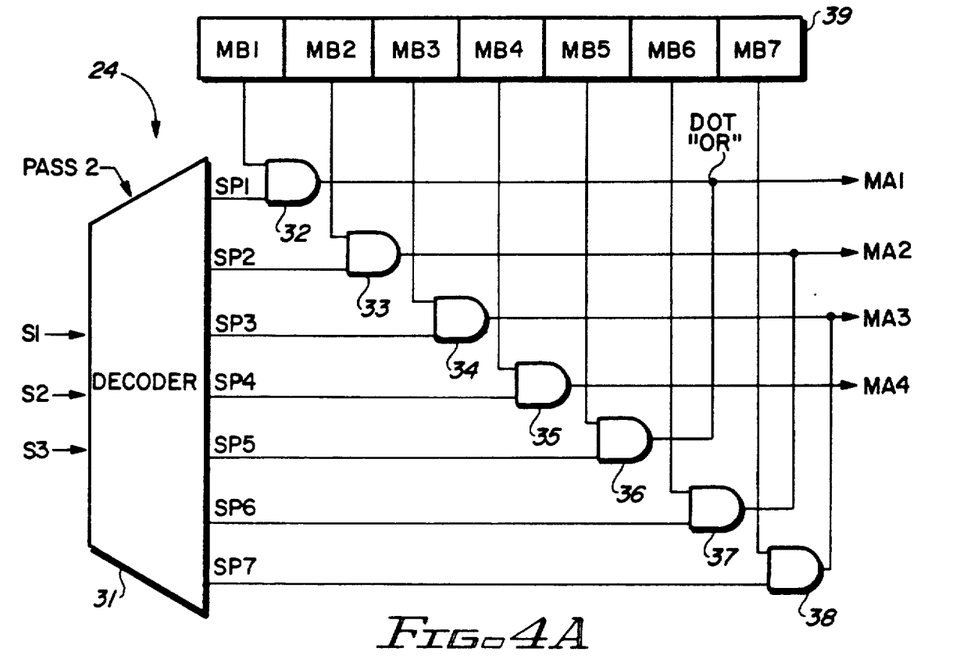
FIG. 4A is a logic diagram of a second pass decoder circuit.

FIG. 4A shows the second pass decoder 24 having a seven to one decoder 31 for receiving the pass2 signal and the 19 three bit syndrome (S1-S3). The decoder 31 outputs second pass signals SP1-SP7 which indicate which column of columns C1-C7 had a fault detected thereon during the second pass test. A seven bit mask register 39 is further provided for masking out single errors from memories not in the subgroup of memories currently under test. If the suspected faulty subgroup were in G1 (i.e., faults counted from C1-C3) then mask register bits MB1-MB3 would be set to "ones" and mask register bits MB4-MB7 would be "zeros". Conversely, if the suspected faulty subgroup were in G2 (i.e., faults counted from C4-C7) then the mask register bits MB1-MB3 would be "zeros" and the mask register bits MB4-MB7 would be set to "ones".

And gates 32-38 work in conjunction with the mask register 39 to ignore faults from the group of memories not currently being tested (G1 or G2). And gates 32-38 each have an input connected to signals SP1-SP7 respectively. Likewise, And gates 32-38 have a second input connected to signals MB1-MB7 respectively. The outputs of the And gates 32-35 provide the mask output signals MA1-MA4 respectively and the outputs of the And gates 36-38 are dot "ORed" to the mask outputs MA1-MA3 respectively.

The masked output signals MA1-MA4 are the address inputs for the error memory 23. Since the error memory 23 only has 4 words MA1-MA4 each represent one word and no further decoding is necessary. Once a group of memories has been identified for second pass testing the appropriate mask bits of the mask bit register 39 will be set. If, for example, an error is suspected in one of the memories D4-D7 (i.e., in G2), the mask bits MB4-MB7 will be set and the mask bits MB1-MB3 will be reset. This ensures that the outputs of the And gates 32-34 will always be zero or inactive and the And gates 35-38 will control the masked outputs MA1-MA4. While the memories D4-D7 are being tested any error that occurs on columns C4-C7 will be decoded by the decoder 31 so that the corresponding second pass signals SP4-SP7 will go high. If D7 were faulty on a particular cycle then SP7 will be "high" which when "ANDed" with MB7 will cause MA4 to go "high". Thus the error count stored in the error memory 23 addressed by MA4 will be read to the counter 15 via the bus 17, incremented, and written back to the same location addressed by MA4.

When the second pass testing is completed the contents of the error memory 23 contains an error count for each memory within the group tested. The error memory 23 also contains a status word for each error count to provide a quick indication of the results of the testing.

If any single memory of the memories D4-D7 generated too many errors that memory may now be identified as faulty and the necessary corrective action thereafter taken. The error memory 23 receives the reset signal and may be reset for the next cycle of testing. Although the fault mapping apparatus 20 has been described with the plurality of memories 3 divided into eight groups it is possible to subdivide into more groups as would be desirable for larger memory arrays.

Figure 5:
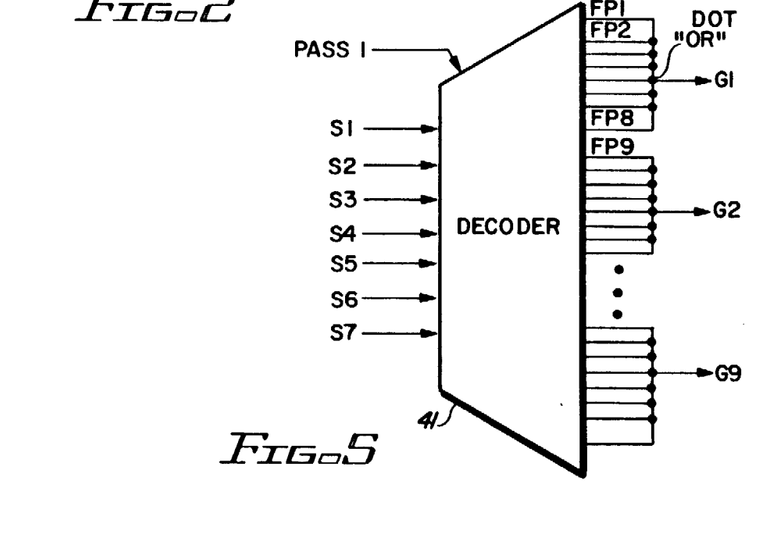
FIG. 5 is a logic diagram of a first pass decoder circuit for a memory array having 72 bit words.
Figure 5A:
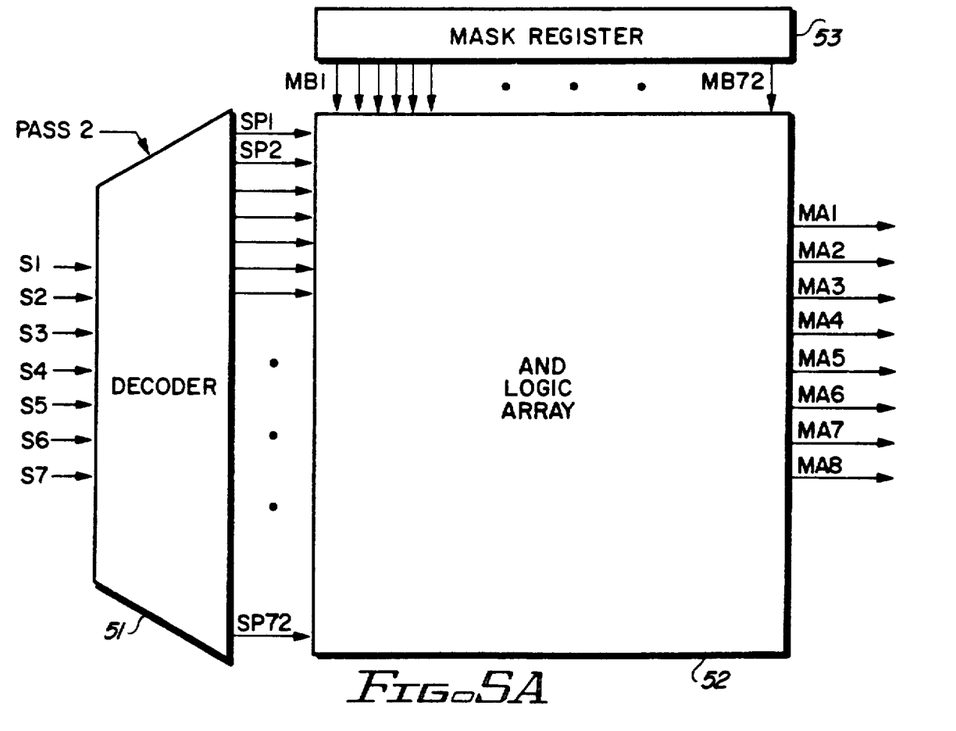
FIG. 5A is a logic diagram of a second pass decoder circuit for a memory array having 72 bit words.

A memory array consisting of words having 72 bits each with 4 rows of memories per card on two cards would require an 1152 word memory in a one pass system or alternatively a nine word memory and an eight word memory in a two pass system. The number of words for the first and second pass can be adjusted according to hardware resources available to the designer. The decoder logic required for a two pass system for a 72 by 8 by 2 memory array is similar to that described in the memory fault mapping apparatus 20. FIG. 5 shows a decoder 41 which requires a seven bit syndrome signal (S1-S7) to decode each bit of the 72 bits in the words (i.e., columns C1-C72). In one such embodiment the outputs of the decoder 41 are grouped into nine groups of eight bits where each of the eight bits are dot "OR'd". Hence a nine bit error memory would be required to store the first pass results. FIG. 5A shows the second pass logic which includes a decoder 51 connected to an And logic array 52 (providing the same function as the And gates 32-38 of FIG. 4A). The decoder 51 also receives the seven bit syndrome signal for one of 72 bit decoding. A mask register 53 having 72 mask bits provides the necessary masking signals to the And logic array 52. The And logic array 52 has eight outputs, MA1-MA8, where each output represents one memory of the eight memories in each subgroup. As a result an eight word memory is sufficient to provide the necessary storage for the second pass testing.

While the invention has been particularly described with reference to particular embodiments thereof, it will be understood by those skilled in the art that various other changes in detail may be made therein without departing from the spirit, scope, and teaching of the invention. For example, the error memories 13 and 23 have been depicted as Static Random Access Memories (SRAM) but it may be desirable to use nonvolatile memory as well. It is further possible to perform the testing using three passes in order to reduce the size of the error memories still further.

What is claimed is:

1. A memory fault mapping apparatus for monitoring randomly accessed data from a plurality of memory chips arranged in rows and columns and addressed by at least a row select address, comprising:

detecting means coupled to the plurality of memory chips for checking the accessed data from said plurality of memory chips and providing an error indication and an error syndrome if an error is detected in the accessed data, the error syndrome indicating the column from which the error was detected;

error memory, coupled to said detecting means and addressable by the error syndrome and the row select address, for storing a count of detected errors generated by each memory chip of said plurality of memory chips in corresponding predetermined locations of said error memory; and counting means coupled to said error memory and to said detecting means for receiving an error count from a selected one of said predetermined locations of said error memory, incrementing the error count if an error indication is provided by said detecting means, and rewriting the incremented error count to said selected one of said predetermined locations of said error memory.

2. The memory fault mapping apparatus according to claim 1 wherein said detecting means is an SEC/DED syndrome generator providing the error syndrome when a single bit error is detected and corrected.

3. The memory fault mapping apparatus according to claim 1 wherein said counting means comprises a single counter.

4. The memory fault mapping apparatus according to claim 1 wherein the error count is accessed, incremented, and rewritten to said selected one of said predetermined locations of said error memory within a single data access cycle.

5. The memory fault mapping apparatus according to claim 1 wherein said error memory is logically divided into two arrays, a first array for storing the count of detected errors generated by each memory chip of said plurality of memory chips and a second array for storing a status word associated with each of the error counts.

6. The memory fault mapping apparatus according to claim 5 wherein each error count and corresponding status word form a fault status having an address corresponding to a memory chip of the plurality of memory chips.

7. The memory fault mapping apparatus according to claim 6 wherein the status word receives cell kill, line kill, and chip kill indications from said counting means when said counting means reaches predetermined first, second and third thresholds, respectfully.

8. The memory fault mapping apparatus according to claim 1 wherein said counting means comprises:
a first input coupled to an output of said detecting means for receiving the error indication;
a second input coupled to an output of said error memory for receiving the error count from said selected one of said predetermined locations; and
an output coupled to an input of said error memory for providing the incremented error count to said selected one of said predetermined locations.

9. A method of mapping detected errors from a plurality of memory chips, comprising the steps of:
a) resetting a plurality of error counts to in predetermined locations of an error memory zeros indicating no errors detected for a corresponding plurality of memory chips organized in rows and columns;
b) randomly accessing said plurality of memory chips for reading data therefrom;
c) checking data read from the plurality of memory chips for errors during each random access;
d) if a single bit error is detected:
correcting the detected single bit error and providing an indication of the existence of the detected error and a location thereof;
reading a first error count from a predetermined location of the error memory corresponding to a first memory chip of the plurality of memory chips that generated the single bit error;
incrementing the first error count; and
writing the incremented first error count back to the predetermined location of the error memory; and e) repeating steps b) through d) until an error count of the plurality of error counts reaches a predetermined threshold or another predetermined event occurs.

10. The method according to claim 9 wherein the step of reading a first error count further comprises the step of providing an address to the error memory indicating the column and the row in which the first memory chip generating the error is located.

11. The method according to claim 10 further comprising the step of providing a status word for each error count indicating when a predetermined threshold or other predetermined event has occurred.

12. The method according to claim 9 wherein steps a) through d) occur during a single data access cycle.

13. The method according to claim 9 wherein said steps of reading, incrementing and writing occur in a single counter for all of the plurality of memory chips.

14. A multi-pass memory fault mapping apparatus for monitoring randomly accessed data from a plurality of memory chips arranged in rows and columns and addressed by at least a row select address, the plurality of memory chips logically divided into a plurality of groups and each group logically divided into a plurality of subgroups, said fault mapping apparatus providing a count of errors generated by the plurality of memory chips, comprising:
detecting means coupled to the plurality of memory chips for checking the accessed data from said plurality of memory chips for errors and providing an error indication and an error syndrome if an error is detected in the accessed data;
first pass decoder means coupled to said detecting means for receiving the error syndrome and for providing a group address indicating a first group from which the error was detected during a first pass of fault mapping;
first error memory coupled to said first pass decoder means and further coupled for receiving subgroup address signals such that, if an error is detected, a first predetermined location of said first error memory is accessed, said first predetermined location corresponding to a first subgroup from which the error was detected and having a first error count stored therein;
counting means coupled to said first error memory for receiving the first error count from said first predetermined location, incrementing the first error count, and returning the incremented first error count to said first predetermined location;
second pass decoder means coupled to said detecting means for receiving the error syndrome, said second pass decoder means being activated when any error count in said first error memory reaches a predetermined threshold to determine which memory chip from a subgroup of memory chips has generated a detected error during a second pass of fault mapping; and
second error memory, coupled to said second pass decoder means and to said counting means, for storing error counts for each memory chip in one of the plurality of subgroups error memory further coupled to said counter, for providing a second error count to said counting means for incrementing and for receiving the incremented error count from said counting means.

15. The multi-pass memory fault mapping apparatus according to claim 14 wherein the detecting means is a SEC/DED syndrome generator providing the error syndrome when a single bit error is detected and corrected.

16. The multi-pass memory fault mapping apparatus according to claim 14 wherein the error count is accessed, incremented, and rewritten to said first predetermined location of said first error memory within a single data access cycle.

17. The multi-pass memory fault mapping apparatus according to claim 14 wherein:
   the first error memory is logically divided into two arrays, a first array for storing the count of first detected errors generated by each subgroup of said plurality of memories and a second array for storing a status word associated with each of the first detected error counts; and
   the second error memory is logically divided into two arrays, a third array for storing the count of second detected errors generated by each memory chip in one of the subgroups and a fourth array for storing a status word associated with each of the second detected error counts.

18. The multi-pass memory fault mapping apparatus according to claim 17 wherein the status word receives cell kill, line kill, and chip kill indications from said counting means when said counting means reaches predetermined first, second and third thresholds, respectfully.

19. The multi-pass memory fault mapping apparatus according to claim 14 wherein the second pass decoder means further comprises:
   a decoder for decoding the error syndrome into a plurality of second pass signals, each second pass signal corresponding to one column of memories chips of said plurality of memory chips;
   a mask bit register providing one mask bit for each column of memory chips; and
   a plurality of And gates each having a first input coupled to receive one of the second pass signals from said decoder and a second input coupled to receive a corresponding one of the mask bits from said mask bit register, said plurality of And gates providing a masked address to said second error memory.

20. The multi-pass memory fault mapping apparatus according to claim 14 wherein said counting means comprises a single counter.

21. A multi-pass memory fault mapping apparatus comprising:
   a plurality of memory chips physically organized by cards, rows, and columns and logically organized into a plurality of groups each being further organized into a plurality of subgroups;
   detecting means coupled to the plurality of memory chips for checking data accessed from said plurality of memory chips and providing an error indication and an error syndrome if an error is detected in the accessed data;
   first pass decoder means coupled to said detecting means for receiving a first enable signal and the error syndrome and for providing a group address a first group from which the error was detected from during a first pass of fault mapping;
   first error memory coupled to said first pass decoder means and further coupled for receiving card and row address signals such that if an error is detected, a first predetermined location of said first error memory is accessed, said first predetermined location corresponding a first subgroup from which the error was detected and having a first error count stored therein, said first error memory comprising:
      a first memory array for retaining the count of errors generated by each subgroup of the plurality of memory chips; and
      a second memory array for retaining a status word associated with each of the error counts; and
   counting means coupled to said first error memory for receiving the first error count from said first predetermined location, incrementing the first error count and returning the incremented first error count to said first predetermined location;
   second pass decoder means coupled to said detecting means for receiving a second enable signal and the error syndrome, said second pass decoder means being activated when an error count in said first error memory reaches a predetermined threshold to determine which memory chip from one of the plurality of subgroups has generated a detected error during a second pass of fault mapping; and
   second error memory coupled to said second pass decoder means and to said counting means for storing error counts, for each memory chip in one of the plurality of subgroups for providing a second error count to said counting means for incrementing and for receiving the incremented error count from said counting means.

22. The multi-pass memory fault mapping apparatus according to claim 21 wherein the detecting means is a SEC/DED syndrome generator providing the error syndrome when a single bit error is detected and corrected.

23. The multi-pass memory fault mapping apparatus according to claim 21 wherein the error count is accessed, incremented, and rewritten to said first predetermined location of said first error memory within a single data access cycle.

24. The multi-pass memory fault mapping apparatus according to claim 23, wherein the status word receives cell kill, line kill, and chip kill indications from said counting means when said counting means reaches predetermined first, second and third thresholds, respectfully.

25. The multi-pass memory fault mapping apparatus according to claim 21 wherein said second pass decoder further comprises:
   a decoder for decoding the error syndrome into a plurality of second pass signals, each second pass signal corresponding to one column of memory chips of said plurality of memory chips;
   a mask bit register having one mask bit for each column of memory chips; and
   a plurality of And gates each having an input coupled to one of the second pas signals from said decoder and a second input coupled to receive a corresponding one of the mask bits from said mask bit register, said plurality of And gates providing a masked address to said second error memory.

26. The multi-pass memory fault mapping apparatus according to claim 21 wherein said counting means comprises a single counter.

* * * * *

UNITED STATES PATENT AND TRADEMARK OFFICE
CERTIFICATE OF CORRECTION

PATENT NO. : 5,233,614

DATED : August 3, 1993

INVENTOR(S) : S. Singh

It is certified that error appears in the above-identified patent and that said Letters Patent is hereby corrected as shown below:

At column 12, line 62, the word "further" should be deleted.

At column 12, line 63, the words "coupled to said counter" should be deleted.

At column 13, line 20, the words "one of the subgroups" should be --one of said subgroups--.

At column 14, line 58, the word "pas" should be --pass--.

Signed and Sealed this

Twenty-fourth Day of May, 1994

*Attest:*

BRUCE LEHMAN

*Attesting Officer*   *Commissioner of Patents and Trademarks*